United States Patent
Kannan et al.

(10) Patent No.: US 9,748,145 B1
(45) Date of Patent: Aug. 29, 2017

(54) SEMICONDUCTOR DEVICES WITH VARYING THRESHOLD VOLTAGE AND FABRICATION METHODS THEREOF

(71) Applicant: GLOBALFOUNDRIES INC., Grand Cayman (KY)

(72) Inventors: Balaji Kannan, Fishkill, NY (US); Unoh Kwon, Fishkill, NY (US); Siddarth Krishnan, Peekskill, NY (US); Takashi Ando, Tukahoe, NY (US); Vijay Narayanan, New Yoark, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/055,826

(22) Filed: Feb. 29, 2016

(51) Int. Cl.
| | |
|---|---|
| H01L 21/8238 | (2006.01) |
| H01L 21/324 | (2006.01) |
| H01L 21/225 | (2006.01) |
| H01L 29/66 | (2006.01) |
| H01L 27/092 | (2006.01) |

(52) U.S. Cl.
CPC .. *H01L 21/823807* (2013.01); *H01L 21/2254* (2013.01); *H01L 21/324* (2013.01); *H01L 21/823828* (2013.01); *H01L 27/092* (2013.01); *H01L 29/66545* (2013.01)

(58) Field of Classification Search
CPC . H01L 51/5237; H05K 5/0017; H05K 5/0234
USPC ........................................................ 438/199
See application file for complete search history.

(56) References Cited

U.S. PATENT DOCUMENTS

| | | | |
|---|---|---|---|
| 7,855,105 B1 | 12/2010 | Jagannathan et al. | |
| 8,420,473 B2 | 4/2013 | Ando et al. | |
| 8,445,974 B2 | 5/2013 | Chidambarrao et al. | |
| 8,481,382 B2 | 7/2013 | Kitano et al. | |
| 8,492,848 B2 | 7/2013 | Gluschenkov et al. | |
| 8,741,757 B2 | 6/2014 | Jagannathan et al. | |
| 2011/0081754 A1* | 4/2011 | Jagannathan ... | H01L 21/823842 438/217 |
| 2012/0181616 A1* | 7/2012 | Chudzik ......... | H01L 21/823842 257/369 |

OTHER PUBLICATIONS

U.S. Appl. No. 14/198,976, filed Mar. 6, 2014.

* cited by examiner

*Primary Examiner* — Andy Huynh
(74) *Attorney, Agent, or Firm* — Scully, Scott, Murphy & Presser, P.C.

(57) ABSTRACT

Semiconductor device fabrication methods are provided which include: providing a structure with at least one region and including a dielectric layer disposed over a substrate; forming a multilayer stack structure including a threshold-voltage adjusting layer over the dielectric layer, the multilayer stack structure including a first threshold-voltage adjusting layer in a first region of the at least one region, and a second threshold-voltage adjusting layer in a second region of the at least one region; and annealing the structure to define a varying threshold voltage of the at least one region, the annealing facilitating diffusion of at least one threshold voltage adjusting species from the first threshold-voltage adjusting layer and the second threshold-voltage adjusting layer into the dielectric layer, where a threshold voltage of the first region is independent of the threshold voltage of the second region.

17 Claims, 9 Drawing Sheets

SEMICONDUCTOR DEVICES WITH VARYING THRESHOLD VOLTAGE AND FABRICATION METHODS THEREOF

FIELD OF THE INVENTION

The present invention relates to semiconductor devices and methods for fabricating the semiconductor devices, and more particularly, to semiconductor devices with varying threshold voltages.

Background

Different semiconductor devices are traditionally fabricated to have one or more different device characteristics, such as threshold voltage, switching speed, leakage power consumption, etc. Multiple different designs may each provide optimization of one or more of these characteristics for devices intended to perform specific functions. For instance, one design may have reduced threshold voltage to increase switching speed for devices providing computational logic functions, and another design may have increased threshold voltage to decrease power consumption for devices providing memory storage functions. As is known in semiconductor device technology, such as, field-effect transistors (FETs), the threshold voltage is the minimum gate voltage required to allow current to flow from a source region to a drain region through a channel region of the FET. A system using multiple discrete devices, each optimized for different functions, will result in greater system complexity, increased system footprint, and added system cost.

Brief Summary

Certain shortcomings of the prior art can be overcome and additional advantages can be provided through the provision, in one aspect, of a method for fabricating a semiconductor device including, for instance, providing a structure with at least one region and including a dielectric layer disposed over a substrate; forming a multilayer stack structure including a threshold-voltage adjusting layer over the dielectric layer, the multilayer stack structure including a first threshold-voltage adjusting layer in a first region of the at least one region, and a second threshold-voltage adjusting layer in a second region of the at least one region; and annealing the structure to define a varying threshold voltage of the at least one region, the annealing facilitating diffusion of at least one threshold-voltage adjusting species from the first sacrificial layer and the second sacrificial layer into the dielectric layer, where a threshold voltage of the first region is independent of the threshold voltage of the second region.

In a further aspect, a semiconductor device is provided which, for instance, includes: a first replacement metal gate structure of a PFET device region having a first effective work function and including a first dielectric layer having a first threshold-adjusting species; and a second replacement metal gate structure of the PFET device region having a second effective work-function and including the first dielectric layer lacking the first threshold-adjusting species, wherein the first effective work function is greater than or equal to 5 eV.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
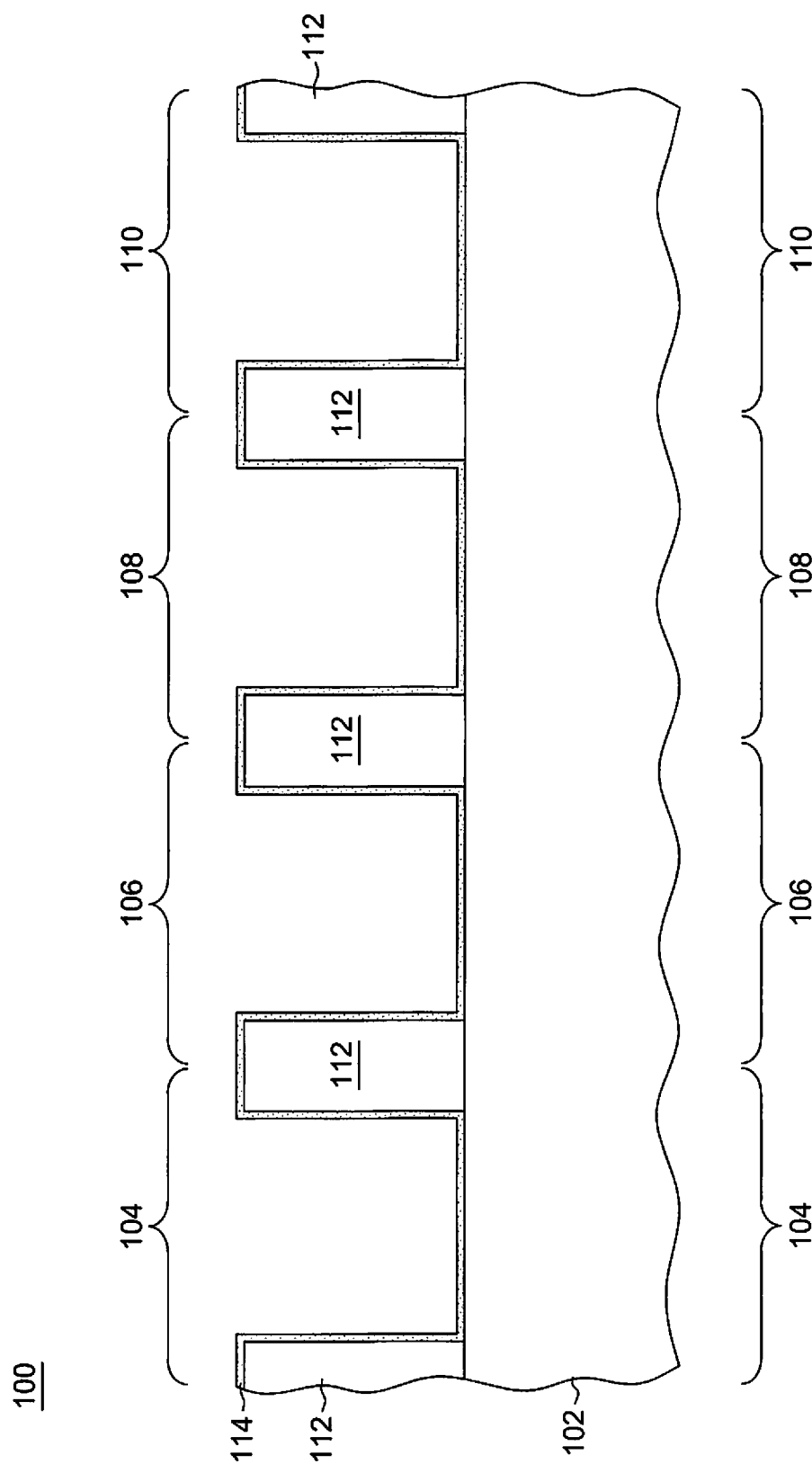
FIG. 1A is a cross-sectional view of an intermediate structure obtained during a gate-last semiconductor device fabrication process, and depicts a dielectric layer disposed within one or more region(s) of a substrate, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in details. It should be understood, however, that the detailed description and the specific examples, while indicating embodiments of the invention, are given by way of illustration only, and not by way of limitation. Various substitutions, modifications, additions and/or arrangements within the spirit and/or scope of the underlying inventive concepts will be apparent to those skilled in the art from this disclosure.

The present invention provides, in part, a method for fabricating a semiconductor device(s), including field-effect transistor (FETs) devices having varying threshold voltages. In one aspect and in a typical integrated circuit, several thousands or more FETs may be interconnected. By way of one example, and in complementary metal-oxide-semiconductor (CMOS) technology, n-type FETs (NFETs) may be interconnected with p-type FETs (PFETs), for example, by sharing a common gate structure, or may be connected by metal contacts. During a typical integrated circuit fabrication process, it may be desirable to optimize leakage, power consumption and speed of the integrated circuit by having different portions of the integrated circuit implemented with different FETs having different threshold voltages. For example, it may be desirable to perform logic or arithmetic functions at a relatively higher speed to enable advanced features, and to perform memory storage at a relatively lower speed to save power. Challenges arise when using conventional fabrication processing to design integrated circuits combining both NFETs and PFETs with multiple threshold voltages. As used herein, a varying threshold voltage refers to a threshold voltage of a FET, for example, either an NFET or a PFET, being modulated independently from a threshold voltage of a corresponding FET, in different regions of the integrated circuit.

In one aspect of the present invention there is provided a method for fabricating a semiconductor device which includes: providing a structure with at least one region and including a dielectric layer disposed over a substrate; forming a multilayer stack structure including a threshold-voltage adjusting layer over the dielectric layer, the multilayer stack structure including a first threshold-voltage adjusting layer in a first region of the at least one region, and a second threshold-voltage adjusting layer in a second region of the at least one region; and annealing the structure to define a varying threshold voltage of the at least one region, the annealing facilitating diffusion of at least one threshold voltage adjusting species from the first threshold-voltage adjusting layer and the second threshold-voltage adjusting layer into the dielectric layer, where a threshold voltage of the first region is independent of the threshold voltage of the second region.

In one embodiment, the multilayer stack structure may include, or be fabricated of, a sacrificial work-function layer, and the threshold-voltage adjusting layer is disposed over the sacrificial work-function layer, where the forming the multilayer stack structure may include, for instance, sizing the sacrificial work-function layer with a thickness to define the varying threshold voltage of the at least one region. As used herein, "sizing" refers to altering or tuning a thickness of the sacrificial work-function layer in at least one region so as to define a threshold voltage of the at least one region. Further, the forming the multilayer stack structure may include sizing the sacrificial work-function layer with a first thickness in the first region and a second thickness in the second region, where the second thickness is less than the first thickness. In one example, the forming the multilayer stack structure may include sizing the sacrificial work-function layer with a thickness that renders the sacrificial work-function layer absent in the second region. That is, no sacrificial work-function layer is provided in the second region.

In one aspect, the multilayer stack structure may include, for instance, a first multilayer stack structure in the first region, and a second multilayer stack structure in the second region, where the first multilayer stack structure is different from the second multilayer stack structure.

By way of example, the first multilayer stack structure may include the first sacrificial work-function layer, the first threshold-voltage adjusting layer disposed over the first sacrificial work-function layer, and a second sacrificial work-function layer disposed over the first threshold-voltage adjusting layer, and where the first threshold-voltage adjusting layer may include, or be fabricated of, a threshold-voltage adjusting species which defines the threshold voltage of the first region. The threshold voltage of the first region may include, for instance, a threshold voltage of a p-type field-effect transistor (PFET) device, with the threshold voltage of the first region within a range from 0 mV to 200 mV. In one example, the threshold-voltage adjusting species of the first sacrificial layer may be, or include, at least one of aluminum (Al), aluminum oxide ($Al_2O_3$), germanium (Ge), germanium oxide ($GeO_2$) or the like.

In another aspect, the second multilayer stack structure may include, for instance, the second threshold-voltage adjusting layer, a capping layer disposed over the second threshold-voltage adjusting layer, and a sacrificial gate material disposed over the capping layer, where the second threshold-voltage adjusting layer may include a threshold-voltage adjusting species which defines the threshold voltage of the second region. By way of example, the threshold voltage of the second region may include a threshold voltage of an NFET device, with the threshold voltage of the second region within a range from 0 mV to 200 mV. For instance, the threshold-voltage adjusting species of the second threshold-voltage adjusting layer may include, or be fabricated of, at least one of a rare-earth metal containing material or an alkaline earth metal-containing material. In one example, the rare-earth metal-containing material may be, or include, at least one of Group IIIB elements of the Periodic Table of Elements. In another example, the alkaline earth metal-containing material may be, or include, a compound having a formula MA, where M may be an alkaline earth metal, and A may be at least one of oxygen (O), sulfur (S) or a halide.

In another embodiment, the at least one region may include, for instance, a third region having a threshold voltage of at least one of an NFET device or a PFET device, where the threshold voltage of the third region is independent of the threshold voltage of the first region and the second region. By way of example, the forming the multilayer stack structure may include, for instance, forming a sacrificial work-function layer over the dielectric layer in the first region, the second region and the third region; removing the sacrificial work-function layer selectively in the first region, without affecting the second region or the third region; and forming an additional sacrificial work-function layer over the first region, the second region and the third region. Further, the forming the multilayer stack structure may include sizing the additional sacrificial work-function layer with a thickness in the first region relative to the thickness of the work-function layer in the second region and the third region, with the sizing of the additional sacrificial work-function layer defining the threshold voltage of the first region.

In a further embodiment, the fabricating method may also include selectively removing the multilayer stack structure in the second region, subsequent to the sizing of the additional sacrificial work-function layer in the first region. The forming may further include forming an additional multilayer stack structure in the first region, the second region and the third region, where the additional multilayer stack structure is different from the multilayer stack structure. Further, the multilayer stack structure in the first region may include the first threshold-voltage adjusting layer having a first threshold-voltage adjusting species, and the additional multilayer stack structure in the second region may include the second threshold-voltage adjusting layer having the second threshold voltage adjusting species, where the first threshold-voltage adjusting layer is different from the second threshold-voltage adjusting layer.

In another embodiment, the fabricating method may further include a work-function layer disposed over the at least one region, subsequent to the annealing of the structure, where the diffusion of the at least one threshold-voltage adjusting species into the dielectric layer defines an effective work-function of the work-function layer in the at least one region, the effective work-function of the work-function layer in the first region, the second region and the third region being independent of each other. For instance, the effective work-function may include a first effective work-function of a first PFET device in the first region, and a second effective work-function of a second PFET device in the third region, the first effective work-function being lower than the second effective work-function.

In yet another aspect of the present invention, there is provided a semiconductor device which includes: a first replacement metal gate structure of a PFET device region having a first effective work function and comprising a first dielectric layer having a first threshold-adjusting species; and a second replacement metal gate structure of the PFET device region having a second effective work-function and comprising the first dielectric layer lacking the first threshold-adjusting species, wherein the first effective work function is greater than or equal to 5 eV.

By way of an example, the first effective work function is 200 mV or greater than the second effective work function. Further, the semiconductor device may include, a first replacement metal gate structure of a NFET device region including the first dielectric layer having a second threshold-adjusting species; and a second replacement metal gate structure of the NFET device region including the first dielectric layer lacking the first threshold-adjusting species and the second threshold-adjusting species.

Reference is made below to the drawings, which are not drawn to scale for ease of understanding, wherein the same reference numbers used throughout different figures designate the same or similar components.

By way of example, FIGS. 1A-1I depict one embodiment of a method for fabricating a semiconductor device with varying threshold voltages in one or more region(s) thereof, in accordance with one or more aspects of the present invention. Advantageously, as described below, the fabricating method may allow for different threshold voltages to be selected for FETs in different regions by modulating a threshold voltage of a FET independent of a threshold voltage of another FET, in accordance with one or more aspects of the present invention.

FIG. 1A depicts a cross-sectional view of an intermediate structure obtained during a replacement gate fabrication process of a semiconductor device, in accordance with one or more aspects of the present invention. As depicted and in one example, intermediate structure 100 may include a substrate 102 and one or more region(s), supporting the formation of planar field-effect transistor (FET) devices or non-planar field-effect transistor (FET) devices such as, for example, fin-type field-effect transistor (FINFET) devices or semiconductor nanowire FET devices.

Substrate 102 may be, for example a bulk semiconductor material such as a bulk silicon wafer. As another example, substrate 102 may also be, or include, any silicon-containing material such as, but not limited to, silicon (Si), single crystal Si, polycrystalline Si or amorphous Si. Substrate 102 may further include a layered semiconductor structure such as, for example, silicon-on-nothing (SON), silicon-on-insulator (SOI), silicon germanium-on-insulator (SGOI), germanium-on-insulator (GOI), silicon-on replacement insulator (SRI) or the like. Substrate 102 may in addition, or instead, include various isolation structures or regions, dopant regions and/or device features. Further, substrate 102 may also include other suitable elementary semiconductors, such as, for instance, germanium (Ge), or a compound semiconductor such as, silicon germanium (SiGe), SiC, SiGeC, gallium arsenide (GaAs), gallium phosphide (GaP), gallium nitride (GaN), indium arsenide (InAs), indium phosphide (InP), and/or all other III/V or II/VI compound semiconductors.

Continuing with FIG. 1A, intermediate structure 100 may further include a layer of interlayer dielectric material (not shown) disposed over substrate 102 which, for instance, may facilitate fabricating the resultant semiconductor devices, such as, for example, field-effect transistor (FETs) devices on the same wafer. By way of example only, the interlayer dielectric material may be, or include, a dielectric material such as, for instance, a field oxide or flowable oxide material which, in one example, may be formed using a variety of techniques such as, chemical vapor deposition (CVD), plasma-enhanced CVD or the like.

As one skilled in the art will understand, a sacrificial gate structure (not shown), which may include, or be fabricated, of a sacrificial gate material (also not shown) such as, amorphous silicon, may be provided over substrate 102, to hold the gate position for subsequent metal gate electrodes to be formed. Subsequent fabrication processing may be performed to form, for instance, a source and drain regions (not shown) over substrate 102. For instance, the source and drain regions may be formed using any suitable techniques, including, for example, ion implantation, epitaxial growth of the embedded source/drain materials and activation anneals. A layer of interlayer dielectric material 112 may subsequently be provided over substrate 102, to fill the spaces between the adjacent sacrificial gate structures, and a chemical-mechanical polish or an etch-back polish may be employed to polish away excess interlayer dielectric material using the sacrificial gate structure, as an etch stop. The sacrificial gate structure may subsequently be removed to create one or more region(s) 104, 106, 108 and 110 over substrate 102 which, for instance, may be separated by interlayer dielectric material 112.

Continuing further with FIG. 1A, one embodiment of an intermediate structure 100 having four field-effect transistor (FETs) devices is illustrated to provide an overall context regarding the present invention. For reasons explained above, it may be desirable for different FETs of an integrated circuit to have different threshold voltages. For instance, a CMOS integrated circuit may require a pair of low threshold voltages and a pair of high threshold voltages, with each pair providing a threshold voltage for each NFET and PFET. As illustrated, for example a pair of regions may be associated with a pair of NFETs providing a low threshold voltage along with a respective high threshold voltage, while a corresponding pair of regions may be associated with a pair of PFETs providing a low threshold voltage along with a high threshold voltage or vice versa. More particularly, and in one example, region(s) 104 and 106 may be associated with a pair of NFETs providing a low threshold voltage and a high threshold voltage, respectively, while region(s) 108 and 110 may be associated with a pair of PFETs providing a low threshold voltage and a high threshold voltage respectively.

Dielectric layer 114 which, for instance, may form part of the resultant gate structure, may be provided conformally within region(s) 104, 106, 108 and 110, for example, as one or more layers using any suitable deposition processes. As used herein, the term "conformally" refers to dielectric layer 114 being disposed along and over the contours of the interlayer dielectric material 112. By way of example, dielectric layer 114 may include, or be fabricated of, a high-k dielectric material with a dielectric constant k greater than the dielectric constant of silicon dioxide (k=3.9 for $SiO_2$), and may be deposited by performing a suitable deposition process, such as atomic layer deposition (ALD), chemical vapor deposition (CVD) or the like. In a particular example, dielectric layer 114 may have a dielectric constant greater than 4.0, and more preferably, greater than 8.0. Examples of high-k dielectric materials which may be used in the dielectric layer include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, and a silicate thereof, and an alloy thereof, where x=0.5 to 3, and y=0 to 2. Although the thickness of the dielectric layer may vary, depending upon the particular application and the deposition process employed, in one example, dielectric layer 114 may have a thickness within a range from 1 nm to 30 nm.

Figure 1B:
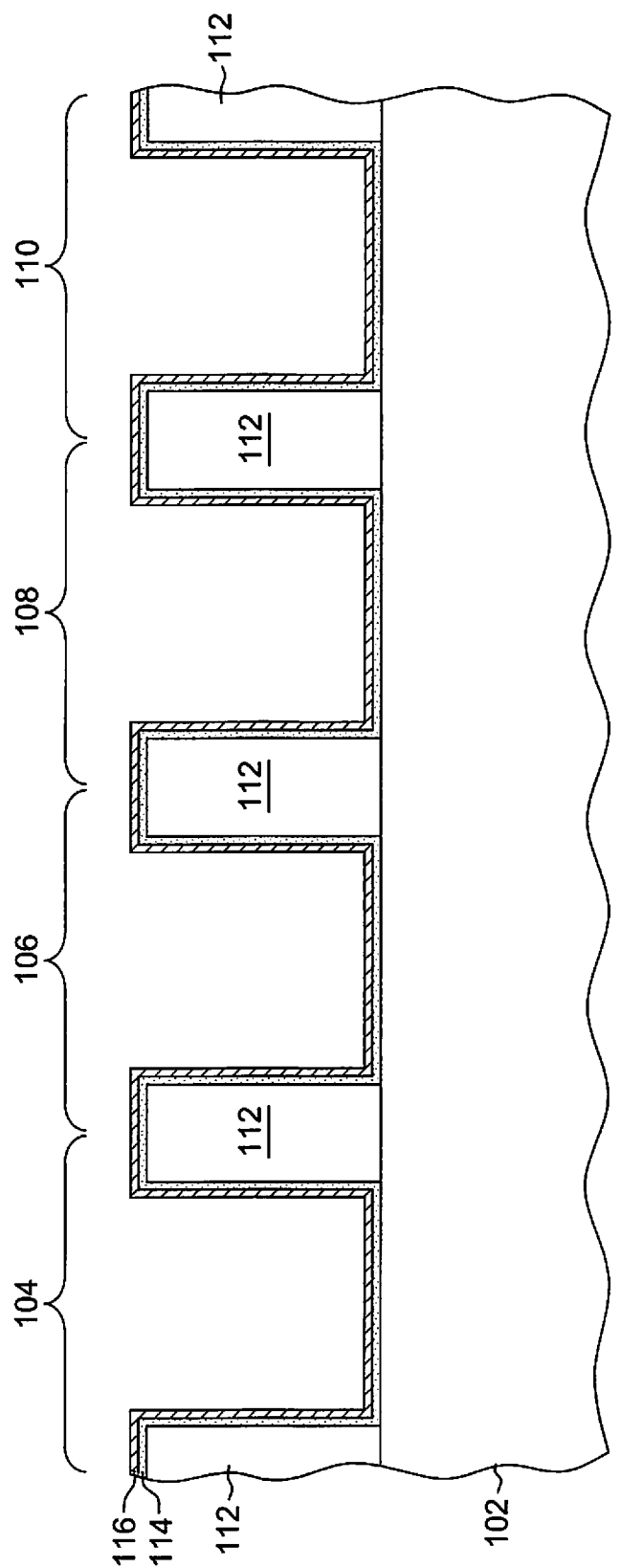
FIG. 1B depicts the structure of FIG. 1A after providing a sacrificial work-function layer conformally over the dielectric layer, in accordance with one or more aspects of the present invention.

FIG. 1B depicts the structure of FIG. 1A after providing sacrificial work-function layer 116 conformally over dielectric layer 114, in accordance with one or more aspects of the present invention. Sacrificial work-function layer 116 may include, or be fabricated of, an appropriate metal nitride, for example, selected from Groups IVA-VIA of the Periodic Table of Elements, such as, titanium nitride (TiN), tantalum nitride (TaN), niobium nitride (NbN), vanadium nitride (VN), tungsten nitride (WN) and the like, depending on whether the gate structure is part of, for instance, a PFET or an NFET device. Although the thickness of sacrificial work-function layer 116 may vary depending upon the particular application, the thickness of the sacrificial work-function layer, in one example, may be within a range from 0.5 nm to 3nm, and may be provided over dielectric layer 114, for example, via a deposition process such as ALD, CVD, physical vapor deposition (PVD) or plasma-enhanced versions of the same. As used herein, "sacrificial work-function layer" refers to a work-function layer that is removed, upon annealing of the structure to diffuse the threshold-adjusting species into the dielectric layer, in accordance with one or more aspects of the present invention.

Figure 1C:
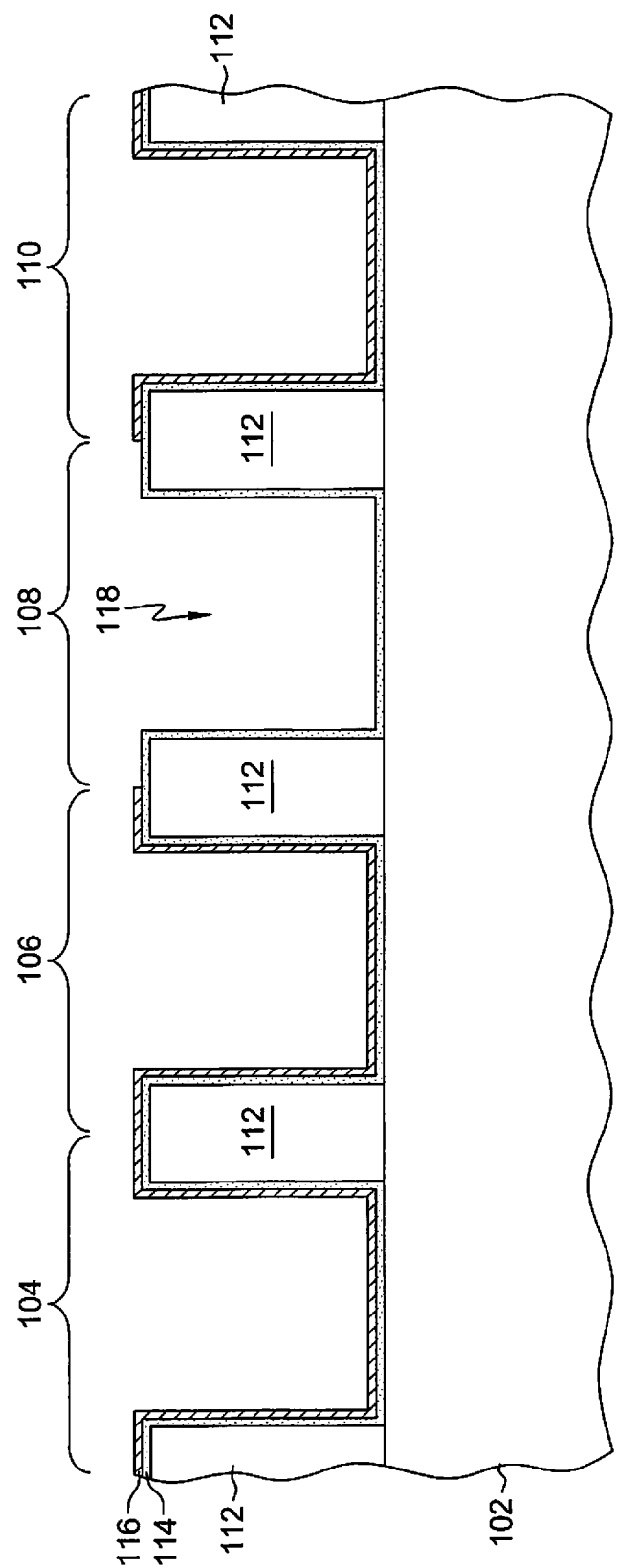
FIG. 1C depicts the structure of FIG. 1B after selectively removing the sacrificial work-function layer from a first region of the substrate, in accordance with one or more aspects of the present invention.

Next, as illustrated in FIG. 1C, one or more processes may be performed to remove sacrificial work-function layer 116 from region 108, leaving dielectric layer 114 exposed to the further processing steps to be disclosed herein. The removing of the sacrificial work-function layer results in creating an opening 118 selectively within region 108, without affecting regions 104, 106 and 110 of the substrate 102. Removal of sacrificial work-function layer 116 from region 108 may be achieved by one or more conventional etching process (es), such as, dry or wet etching processing. In one example, sacrificial work-function layer 116, such as titanium nitride (TiN), may be removed using an ammonia-based solution, for instance, standard clean process (referred to as SC1 solution) to expose the underlying dielectric layer 114 in region 108. In a specific example, the SC1 process which, for instance, includes a solution of hydrogen peroxide ($H_2O_2$) and ammonium hydroxide ($NH_4OH$) may be performed with temperature between room temperature (about 20° C.) and about 65° C. for a time period of about 30 seconds to about 10 mins. Alternatively, the removal of titanium nitride work-function layer 116 may also be accomplished using a solution of hydrogen peroxide ($H_2O_2$), along with a conventional SC1 solution process.

Figure 1D:
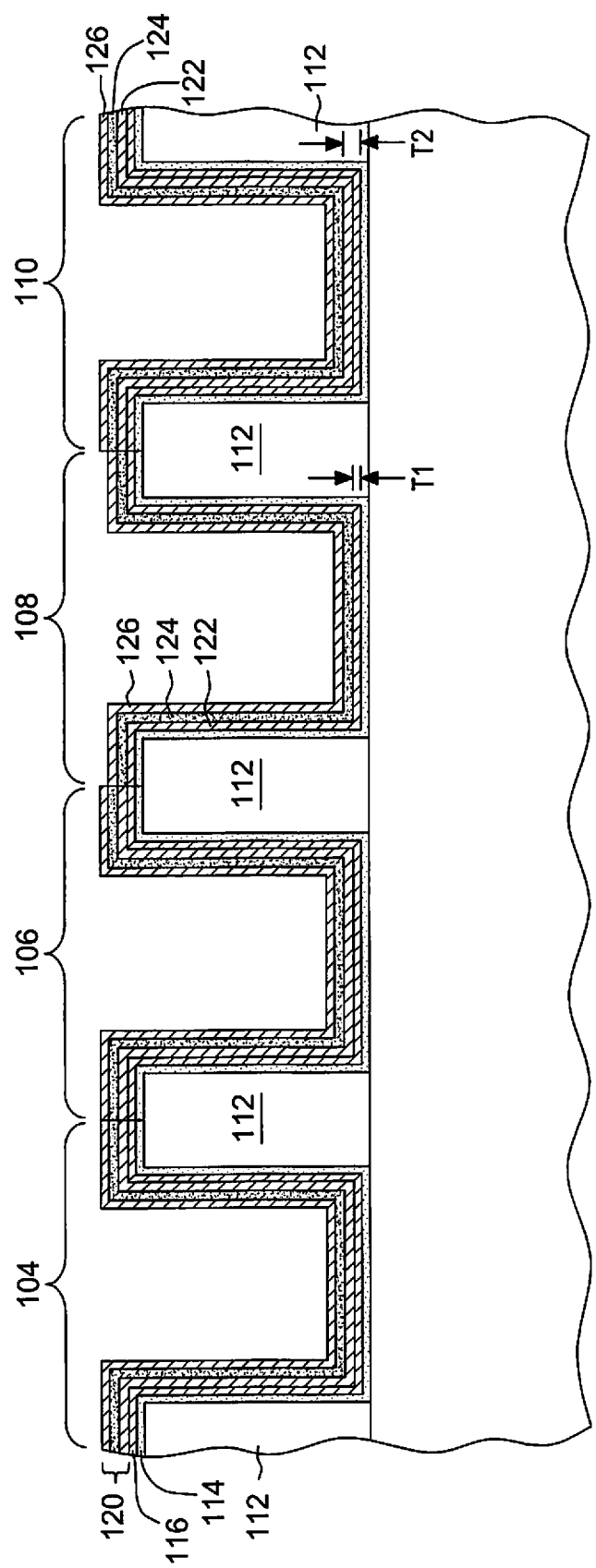
FIG. 1D depicts the structure of FIG. 1C after forming a multilayer stack structure, in accordance with one or more aspects of the present invention.

A multilayer stack structure 120 may be formed conformally over dielectric layer 114 of regions 104, 106, 108 and 110, as depicted in FIG. 1D. This multilayer stack structure 120 includes, for instance, an additional sacrificial work-function layer 122, a threshold-voltage adjusting layer 124 disposed over additional sacrificial work-function layer 122, and a second sacrificial work-function layer 126 disposed over threshold-voltage adjusting layer 124. These layers of multilayer stack structure 120 may be formed using a variety of different materials and fabrication techniques, such as chemical-vapor deposition (CVD), atomic layer deposition (ALD), physical vapor deposition (PVD) or plasma-enhanced versions of such processes. The thicknesses of the depicted layers may also vary, depending on the particular application.

By way of example, additional sacrificial work-function layer 122 may include, or be fabricated of, a material that is substantially similar or the same as, the material of sacrificial work-function layer 112 disposed over dielectric layer 114 in regions 104, 106 and 110. As described above in connection with FIG. 1B, additional sacrificial work-function layer 122 may include, or be fabricated of, an appropriate metal nitride, for example, selected from Groups IVA-VIA of the Periodic Table of Elements, such as, titanium nitride (TiN), tantalum nitride (TaN), niobium nitride (NbN), vanadium nitride (VN), tungsten nitride (WN) and the like, and may be formed by employing one or more deposition process(es) described above. The deposition of additional sacrificial work-function layer 122 directly over dielectric layer 114 in region 108 allows for sizing or modulating a thickness of the sacrificial work-function layer in multiple different regions, enabling FETs having multiple different threshold voltages. For instance, by sizing or tuning a thickness of additional sacrificial work-function layer 122 in region 108 relative to thicknesses of sacrificial work-function layer 116 along with additional sacrificial work-function layer 122 in different regions, for example, regions 104, 106 and 110, different threshold voltages may be achieved. In one example, the thickness of additional sacrificial work-function layer 118 may be within a range from 0.5nm to 3 nm.

Continuing with FIG. 1D, threshold-voltage adjusting layer 124 of multilayer stack structure 120 may subsequently be formed over additional sacrificial work-function layer 122. By way of example, threshold-voltage adjusting layer 124, having a thickness within a range from 0.5 nm to 3 nm, may include, or be fabricated of, a threshold-voltage adjusting species which, for instance, may be a PFET threshold-voltage adjusting species, thereby defining the threshold voltage for a PFET device in region 108. As used herein, "threshold-voltage adjusting species" refers to an element or a chemical that defines the threshold voltage of the region, for instance, NFET or PFET, depending on the type of device being fabricated within the exposed region. In one example, the threshold-voltage adjusting species of threshold-voltage adjusting layer 124 may be, or include, at least one of aluminum (Al), aluminum oxide ($Al_2O_3$), germanium (Ge), germanium oxide ($GeO_2$), titanium aluminum carbide (TiAlC) or combinations thereof. In a specific example, the threshold-voltage adjusting species, such as, for instance, titanium aluminum carbide (TiAlC), having about 5 to 50% of aluminum disposed therein, may facilitate defining the threshold voltage of a PFET device.

A second sacrificial work-function layer 126 of multilayer stack structure 120 may be deposited over threshold-voltage adjusting layer 124. Second sacrificial work-function layer 126, for example, may include, or be fabricated of, a material that is substantially similar or the same as, the material of additional sacrificial work-function layer 122 and sacrificial work-function layer 112 disposed over dielectric layer 114 in regions 104, 106 and 110. As described above in connection with FIG. 1B, second sacrificial work-function layer 126 may include, or be fabricated of, an appropriate metal nitride, for example, selected from Groups IVA-VIA of the Periodic Table of Elements, such as, titanium nitride (TiN), tantalum nitride (TaN), niobium nitride (NbN), vanadium nitride (VN), tungsten nitride (WN) and the like, and may be formed by employing one or more deposition process(es) described above. In one example, the thickness of second sacrificial work-function layer 126 may be within a range from 0.5 nm to 3 nm. In one example, and when threshold-voltage adjusting layer 124 includes a titanium aluminum carbide layer, the additional sacrificial work-function layer 122 and second sacrificial work-function layer 126 sandwiching the threshold-voltage adjusting layer may advantageously facilitate protecting the aluminum disposed therein, from being oxidized under ambient conditions.

Figure 1E:
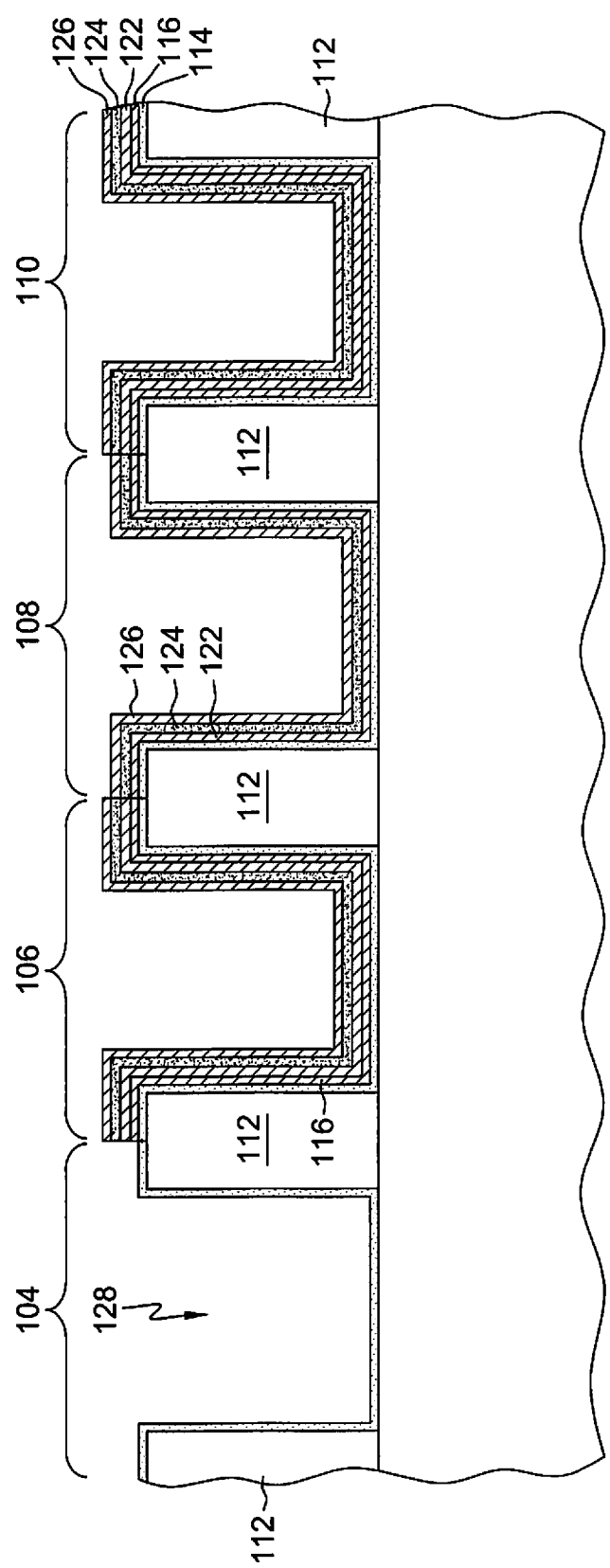
FIG. 1E depicts the structure of FIG. 1D after selectively removing the multilayer stack structure within a second region of the substrate, in accordance with one or more aspects of the present invention.

Next, as depicted in FIG. 1E, one or more lithographic patterning processes may be employed to selectively remove multilayer stack structure 120 from region 104 of substrate 102 and create an opening 128 therein. For instance, the multilayer stack structure may be patterned by employing a series of protective masks to protect the multilayer stack structure disposed within regions 106, 108 and 110, leaving multilayer stack structure 120 of region 104 exposed for any suitable etching processes, such as, dry or wet etching processing. In one example, the wet etching may be performed using, for instance, an SCI solution (e.g., including $H_2O_2$ and $NH_4OH$) at a temperature in the range of room temperature (about 20° C.) to about 65° C. for a time ranging from 30 secs to 10 mins. Note that, as illustrated, this selective removing of multilayer stack structure 120 from region 104 results in exposing dielectric layer 114 to the further processing steps to be disclosed herein.

Figure 1F:
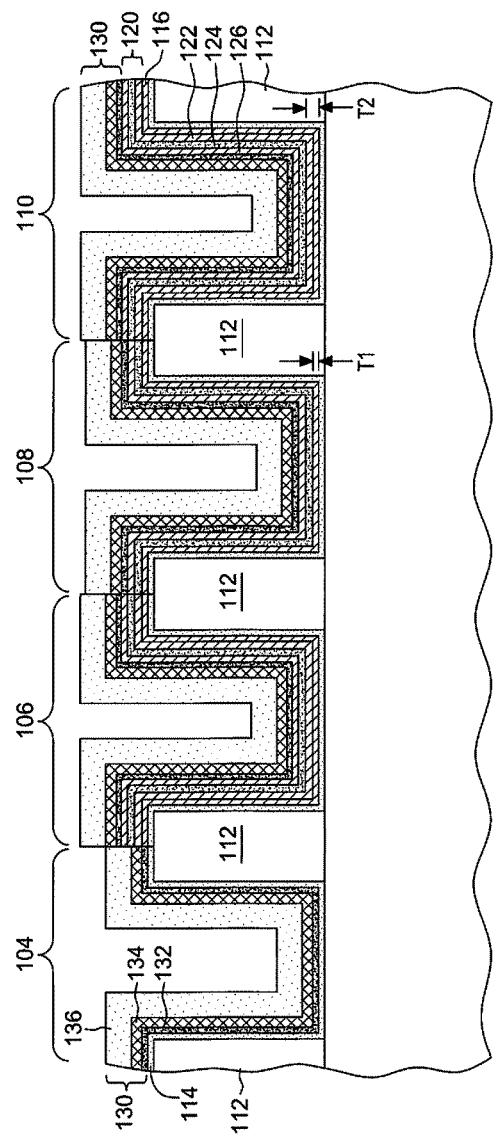
FIG. 1F depicts the structure of FIG. 1E after forming an additional multilayer stack structure, in accordance with one or more aspects of the present invention.

FIG. 1F depicts the structure of FIG. 1E after forming an additional multilayer stack structure 130 conformally within regions 104, 106, 108 and 110 of the wafer. This additional multilayer stack structure 130 includes, for instance, a threshold-voltage adjusting layer 132, a capping layer 134 disposed over threshold-voltage adjusting layer 132, and a gate material 136 disposed over capping layer 134. As depicted, additional multilayer stack structure 130 may be disposed over multilayer stack structure 120 (FIG. 1D) in regions 106, 108 and 110, while being disposed directly over dielectric layer 114 in region 104. The various layers that provide additional multilayer stack structure 130 may be formed using a variety of different materials and fabrication techniques, such as chemical-vapor deposition (CVD), atomic layer deposition (ALD), molecular beam deposition, metallorgano chemical vapor deposition (MOCVD), physical vapor deposition (PVD) or plasma-enhanced versions of such processes. The thicknesses of the depicted layers may also vary, depending on the particular application.

As illustrated, the different layers of additional multilayer stack structure 130 are distinctly different from the different layers of multilayer stack structure 120 (FIG. 1D). By way of example, threshold-voltage adjusting layer 132 may include, or be fabricated of, a threshold-voltage adjusting species which, for instance, may be an NFET threshold-voltage adjusting species, thereby defining the threshold voltage for an NFET device in region 104 of the substrate. In one example, the threshold-voltage adjusting species of threshold-voltage adjusting layer 132, having a thickness within a range of about 0.05 nm to 1 nm, may be, or include, at least one of a rare earth metal-containing material or an alkaline earth metal-containing material. In a specific example, the rare earth metal-containing material may be, or include, at least one of a Group IIIB element of the Periodic Table of Elements including, for example, La, Ce, Pr, Nd, Pm, Sm, Eu, Ga, Tb, Dy, Ho, Er, Tm, Yb, Lu or combinations thereof. More particularly, the rare-earth metal-containing material may be, or include, at least of La, Ce, Y, Sm, Er and/Tb, with La being more preferred. In another specific example, the threshold-voltage adjusting species may be or include an alkaline earth metal-containing material, having a chemical formula MA, where M may be an alkaline earth metal selected from Group IIA of the Periodic Table of Elements(including, for instance, Be, Mg, Ca, Sr, Ba or combinations thereof), A may be at least one of oxygen (O), sulfur (S) or a halide, and x=0, 1 or 2. In one particular example, the alkaline earth metal-containing material may be Mg.

Capping layer 134 may be provided to protect threshold-voltage adjusting layer 132 from damage during various processing steps. In one example, capping layer 134 may be, or include, titanium nitride (TiN) or tantalum nitride (TaN), and may have a thickness of approximately between 1 nm to 3 nm. Sacrificial gate material 136 may subsequently be provided over capping layer 134. This sacrificial gate material 136 may be or include, for instance, amorphous-silicon (a-Si) or polysilicon material to hold, in one embodiment, the gate position for the subsequent metal gate electrode to be formed, using (for instance) a gate-last processing approach.

As illustrated and in one embodiment, the sacrificial work-function layer(s), for example, sacrificial work-function layer 116, and additional sacrificial work-function layer 122 of multilayer stack structure 120 may be sized to have different thicknesses in different regions of substrate 102, enabling different gate stack structures in different regions. Advantageously, these different gate stack structures in different regions, in turn, enable multiple threshold voltages in different regions to be achieved. For instance, and as depicted, forming additional sacrificial work-function layer 122 of multilayer stack structure 120 directly over dielectric layer 114 in region 108 results in the sacrificial work-function layer having a thickness T1, while forming the additional sacrificial work-function layer 122 over sacrificial work-function layer 116 results in the work-function layer with a thickness T2 in regions 106 and 110, with the thickness T1 being less than the thickness T2. By contrast, the sacrificial work-function layer has been sized to have a thickness that renders it to be absent in region 104 of the substrate. As discussed further below, these differences in the thicknesses of the sacrificial work-function layers in different regions are utilized to modulate a threshold voltage of a FET independent of a threshold voltage of another FET.

Figure 1G:
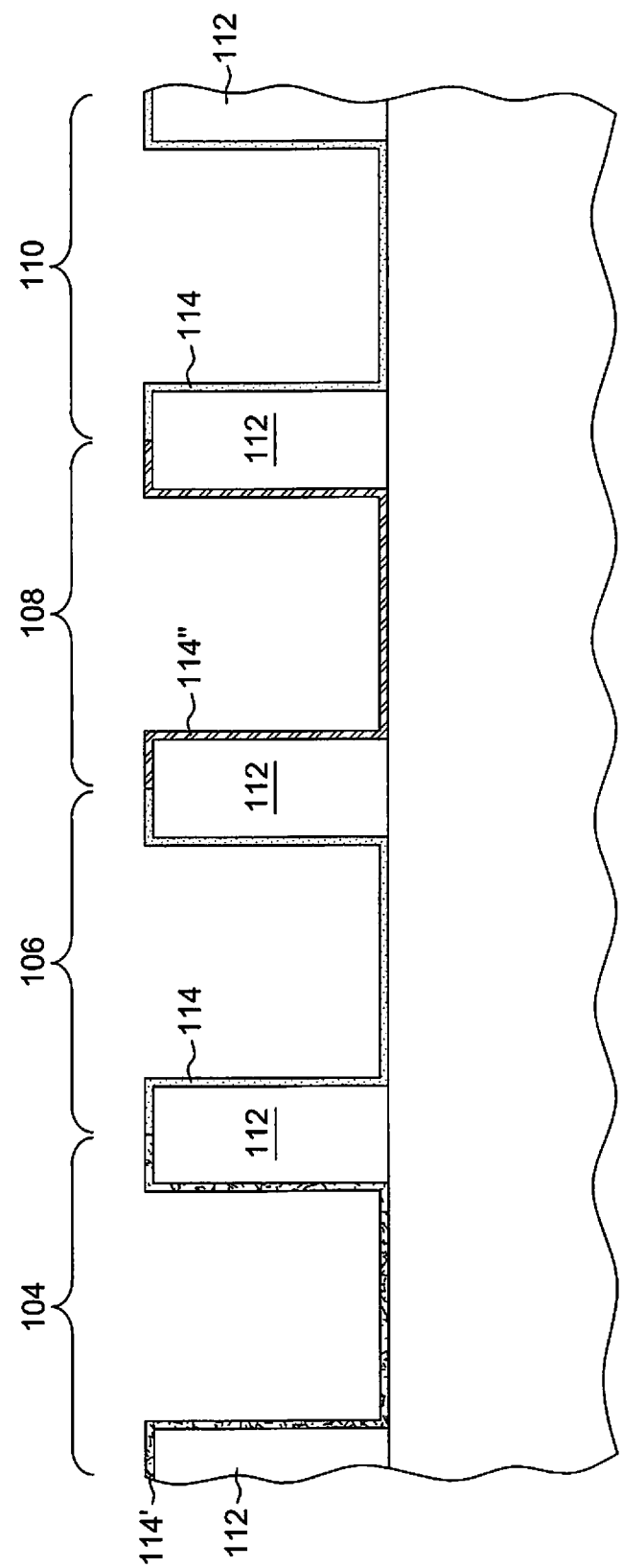
FIG. 1G depicts the structure of FIG. 1F after annealing to define the threshold voltage(s) of the first region and the second region, and subsequent removal of the multilayer stack structure and the additional multilayer stack structure, in accordance with one or more aspects of the present invention.

Referring to FIG. 1G, structure 100 may be subjected to one or more annealing processes to diffuse the threshold-voltage adjusting species from different threshold-voltage adjusting layer(s) into underlying dielectric layer 114. This diffusion of the threshold-voltage adjusting species, advantageously, facilitates defining the threshold voltage(s) of different regions, for instance, in regions 104, 106, 108 and 110. By way of an example, the annealing process may be performed using a variety of available annealing techniques such as, for example, soak anneal, spike/rapid thermal anneal (RTA) or laser anneal (LSA) in presence of gases such as, nitrogen and/or argon. In a specific example, a LSA anneal may be performed at a temperature of about 800° C. to 1100° C. for about 1 millisec to 30 secs.

Further and in one embodiment, the annealing process advantageously facilitates in at least partially diffusing the threshold-voltage adjusting species from the threshold-voltage adjusting layers (for instance, threshold-voltage adjusting layer 124 and 132 (see FIG. 1F)) into the underlying dielectric layer 114, thereby changing the electrical properties of dielectric layer 114. In one example, upon annealing, the NFET threshold-voltage adjusting species, such as, lanthanum, from threshold-voltage adjusting layer 132 (see FIG. 1F) may at least partially diffuse into underlying dielectric layer 114, resulting in a dielectric layer 114' (dielectric layer 114' may also be referred to herein as a threshold voltage (Vt) adjusted dielectric layer) in region 104. This dielectric layer 114' with its electrical property having been changed defines the threshold voltage of NFET device in region 104. In this example, the threshold voltage of the NFET device in region 104 may be within the range from 0 mV to 200 mV. Further, the threshold voltage of the NFET device in region 104 may be modulated independent of the threshold voltage of the NFET device in region 106 by varying gate stack structures in region 104 and region 106, and also by sizing or tuning the thicknesses of the different sacrificial work-function layers disposed between the threshold-voltage adjusting layer of the different multilayer stack structures and dielectric layer 114. In such an example, the threshold voltage of the NFET device in region 106 may be higher by an order of about 50 mV to about 200 mV, higher than the threshold voltage of the NFET device in region 104.

In another example, the PFET threshold-voltage adjusting species, such as, aluminum, from threshold-voltage adjusting layer 124 (see FIG. 1F) may at least partially diffuse into dielectric layer 114 resulting in a dielectric layer 114" (dielectric layer 114" may also be referred to herein as a threshold voltage (Vt) adjusted dielectric layer) in region 108. This dielectric layer 114" with its electrical property having been changed defines the threshold-voltage PFET device in region 108. Further, as described above, the threshold voltage of the PFET device in region 108 may be modulated independent of the threshold voltage of the PFET device in region 110 by sizing or tuning the thicknesses of the different sacrificial work-function layers disposed between the threshold-voltage adjusting layer of the multilayer stack structures and dielectric layer 114. This sizing or tuning of the thicknesses of the sacrificial work-function layers, in turn, defines the different threshold voltages in different regions by modulating the concentration/amount of threshold-voltage adjusting species being diffused into the dielectric layer.

As one skilled in the art will understand, the effective work-function of the cumulative stack of materials in a gate structure directly impacts the threshold voltage of a FET device. Referring to FIG. 1F, one of the items which influence the effective work function of the FET may be the sacrificial work-function layer 122 having a thickness T1 (see FIG. 1F). The thickness of sacrificial work-function layer 122 facilitates diffusing a greater concentration of the threshold-voltage adjusting species into dielectric layer 114 in region 108, thereby changing the electrical properties such as, increase in a work-function shift, increase in the $T_{inv}$ (inverse of gate capacitance) of the dielectric layer in region 108. These changes in the electrical properties, in turn, result in defining threshold voltage of PFET device in region 108. In one example, the threshold voltage of PFET device in region 108 may be from about 0 mV to about 200 mV.

In another example, the sacrificial work-function layer having a thickness T2 (see FIG. 1F) (for instance, including sacrificial work-function layer 116 and additional sacrificial work-function layer 122) in region 110 facilitates diffusing the threshold-voltage adjusting species having a lower concentration relative to the concentration of the threshold-voltage adjusting species being diffused into the underlying dielectric layer 114 in region 108. This decreased concentration of the threshold-voltage adjusting species diffused into the dielectric layer, in turn, results in lowering the work-function shift as well as lower $T_{inv}$ penalty, thereby defining the threshold voltage of region 110. In this example, region 110 has a higher PFET threshold voltage relative to the threshold voltage of region 108. In a specific example, the PFET threshold voltage of region 110 may be higher than that of region 108 by an order of about 50 mV to about 200 mV.

As further depicted in FIG. 1G, one or more etching processes are performed to remove the sacrificial work-function layer 116 (see FIG. 1F), multilayer stack structure 120 (see FIG. 1F) and additional multilayer stack structure 130 (see FIG. 1F) from regions 104, 106, 108 and 110, and to expose the dielectric layer in different regions. By way of example, the etching processes may be accomplished using a series of isotropic wet etching processes using, for instance, ammonia based etching solutions such as, standard clean 1 process (referred to as SC1) and standard clean 2 process (referred to as SC2). For instance, SC1 process may be accomplished using hydrogen peroxide ($H_2O_2$) and ammonium hydroxide ($NH_4OH$) and SC2 process may be accomplished using water, hydrogen peroxide ($H_2O_2$) and hydrochloric acid (HCl). Choice of etching chemistries may be motivated by efficiency in removing these layers, without affecting the underlying dielectric layer.

Figure 1H:
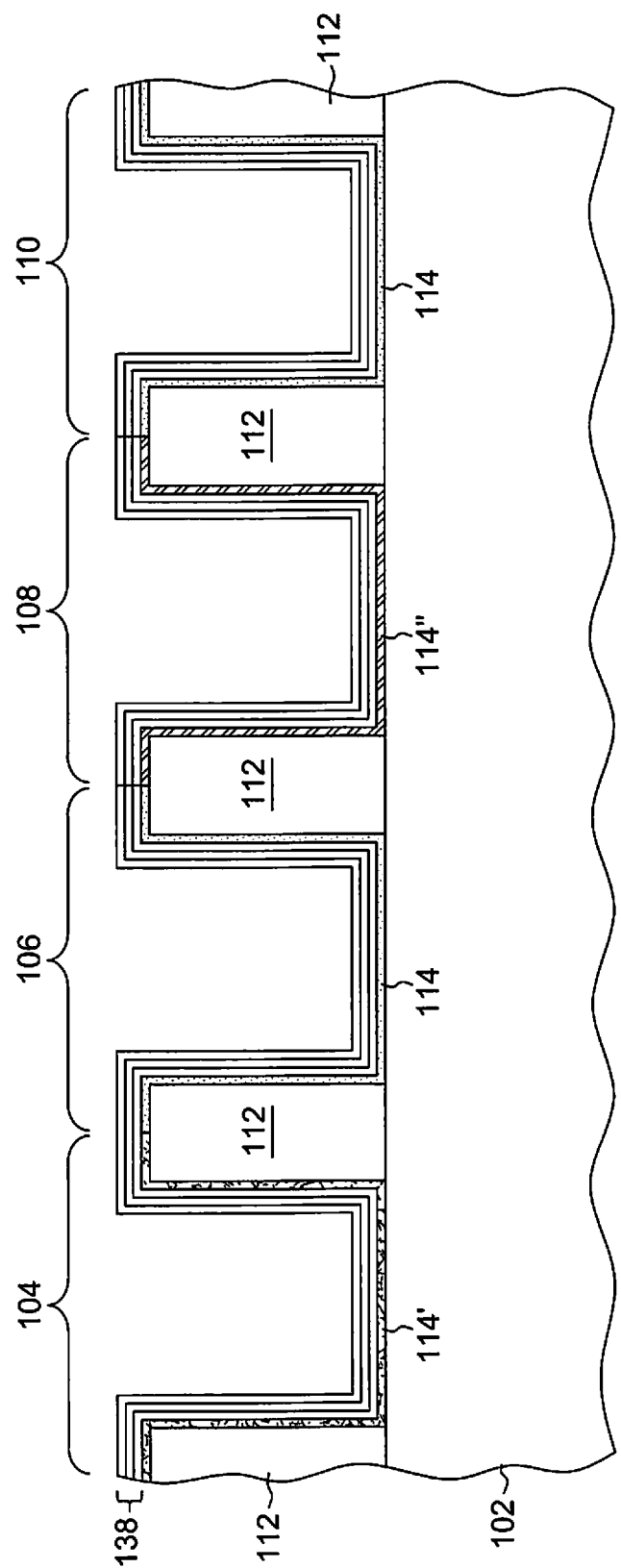
FIG. 1H depicts the structure of FIG. 1G after disposing one or more work-function layers within the region(s) of the substrate, in accordance with one or more aspects of the present invention.

FIG. 1H depicts the structure of FIG. 1G after disposing one or more work-function layers 138 within the regions of the substrate. These work-function layers which, for instance, may form part of the replacement gate structure, may be, or include, metals and their nitrides such as, titanium nitride (TiN, TaN, TiAlN, TaAlN, NbN, VN, WN. In another example, work-function layer(s) 138 may also include metals and their carbides such as, TiC, TiAlC, TiAl, TaC, TaAlC, NbC etc. In another example, work-function layer(s) 138 may also include Ru, Pt, Mo, Co and alloys and combinations thereof. While for simplicity of illustration the work-function layer(s) 138 are labeled the same in the NFET device regions 104 and 106, and PFET device regions 108 and 110 in the FIG. 1H, one skilled in the art will recognize that the NFET device regions and PFET device regions usually have different work function layer(s) 138.

Further, in one embodiment, the differential doping concentrations/amounts of threshold-adjusting species diffused within the dielectric layer 114, advantageously, facilitates defining an effective work-function of the regions (e.g., FETs) 104, 106, 108 and 110, and in particular, in regions 104 and 108. For instance, the effective work-functions of the FETs between the two PFET device regions 108 and 110, owing to the different concentrations of the same threshold-adjusting species disposed within the underlying dielectric layer 114" and 114, respectively. For instance, and in one example, the effective work-function of PFET device region 110 may be from about 4.6 eV to about 4.8 eV, owing to the minimum concentration of threshold-voltage adjusting species diffused within dielectric layer 114. In a specific example, the effective work-function layer of PFET device region 110 may be about 4.8 eV. Similarly, the effective work-function of PFET device region 108, owing to a higher concentration of threshold-voltage adjusting species diffused within dielectric layer 114", may be from about 4.8 eV to about 5.0 eV. In a specific example, the effective work-function layer of the work-function layer may be about 5.0 eV. This is significant for two reasons. First, PFET devices of a replacement metal gate structure having an effective work function as high as 5.0 eV have not been obtainable in the past. Second, the ability to tune the work-function (and hence threshold voltage) of two PFET device regions by 200 mV or more was not possible. In another example, the effective work-function of the NFET device region 104, owing to a higher concentration of threshold-adjusting species diffused within the dielectric layer 114', may be within a range of about 4.1 eV to 4.5 eV, while the NFET device region 106, with a decreased concentration of the threshold-adjusting species within the underlying dielectric layer 114, may have an effective work-function from about 4.2 eV to 4.6 eV.

Figure 1I:
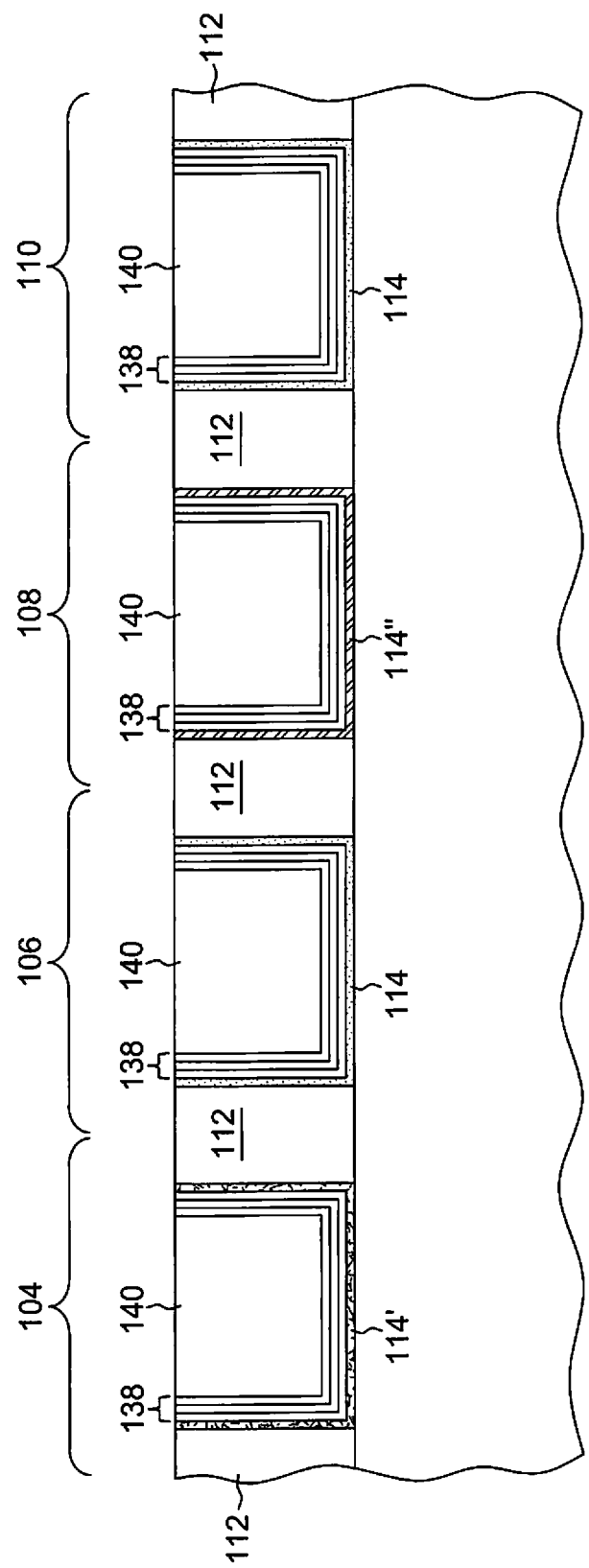
FIG. 1I depicts a resultant structure of FIG. 1H with a replacement gate structure having been formed within the region(s) of the substrate, in accordance with one or more aspects of the present invention.

FIG. 1I depicts a resultant structure of FIG. 1H with a gate material 140 having been formed within the region(s) of the substrate, in accordance with one or more aspects of the present invention. Gate material which, for instance, may form part of the resultant replacement gate structure, may be any of a variety of at least one metal gate electrode material, such as, tungsten (W), aluminum (Al), nickel (Ni), cobalt (Co), and titanium (Ti), and may be conformally deposited within regions 104, 106, 108 and 110 using processes such as, ALD or CVD. As one skilled in the art will understand, a replacement gate structure will include one or more gate materials that are placed in an opening of a dielectric layer formed by the removal of a sacrificial gate structure. Thus, replacement gate structures typically have at least one film having an U-shaped profile in the gate opening.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form of contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claims. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the present invention for various embodiments with various modifications as are suited to the particular use contemplated.

What is claimed is:

1. A method for fabricating a semiconductor device, the method comprising:
   providing a structure with at least one region and including a dielectric layer disposed over a substrate. wherein the at least one region is present in an opening located in an interlayer dielectric material that is disposed directly on the substrate;
   forming a multilayer stack structure comprising a threshold-voltage adjusting layer over the dielectric layer, the multilayer stack structure comprising a first threshold-voltage adjusting layer in a first region of the at least one region, and a second threshold-voltage adjusting layer in a second region of the at least one region; and
   annealing the structure to define a varying threshold voltage of the at least one region, the annealing facilitating diffusion of at least one threshold-voltage adjusting species from the first threshold-voltage adjusting layer and the second threshold-voltage adjusting layer into the dielectric layer, wherein a threshold voltage of the first region is independent of the threshold voltage of the second region.

2. The method of claim 1, wherein the multilayer stack structure comprises a sacrificial work-function layer, and the threshold-voltage adjusting layer is disposed over the sacrificial work-function layer, wherein the forming the multilayer stack structure comprises sizing the sacrificial work-function layer with a thickness to define the varying threshold voltage of the at least one region.

3. The method of claim 2, wherein the forming comprises sizing the sacrificial work-function layer with a first thickness in the first region and a second thickness in the second region, the second thickness is less than the first thickness.

4. The method of claim 2, wherein the forming comprises sizing the sacrificial work-function layer with a thickness that renders the sacrificial work-function layer to be absent in the second region.

5. The method of claim 1, wherein the multilayer stack structure comprises a first multilayer stack structure in the first region, and a second multilayer stack structure in the second region, the first multilayer stack structure is different from the second multilayer stack structure.

6. The method of claim 5, wherein the first multilayer stack structure comprises a first sacrificial work-function layer, the first threshold-voltage adjusting layer disposed over the first sacrificial work-function layer, and a second sacrificial work-function layer disposed over the first threshold-voltage adjusting layer, and wherein the first threshold-voltage adjusting layer includes a threshold voltage adjusting species which defines the threshold voltage of the first region.

7. The method of claim 6, wherein the threshold voltage of the first region comprises a threshold voltage of a p-type field-effect transistor (pFET) device, the threshold voltage of the first region is from 0 mV to 200 mV, and wherein the threshold voltage adjusting species of the first threshold-voltage adjusting layer comprises at least one of aluminum (Al), aluminum oxide ($Al_2O_3$), germanium (Ge) or germanium oxide ($GeO_2$).

8. The method of claim 5, wherein the second multilayer stack structure comprises the second threshold-voltage adjusting layer, a capping layer disposed over the second threshold-voltage adjusting layer, and a sacrificial gate material disposed over the capping layer, wherein the second threshold-voltage adjusting layer includes a threshold voltage adjusting species which defines the threshold voltage of the second region.

9. The method of claim 8, wherein the threshold voltage of the second region comprises a threshold voltage of an n-type field-effect transistor (nFET) device, the threshold voltage of the second region is within a range from 0 mV to 200 mV, and wherein the threshold voltage adjusting species of the second threshold-voltage adjusting layer comprises at least one of a rare earth metal-containing material or an alkaline earth metal-containing material.

10. The method of claim 1, wherein the at least one region comprises a third region having a threshold voltage of at least one of an n-type field-effect transistor (nFET) device or a p-type field-effect transistor (pFET) device, the threshold voltage of the third region being independent of the threshold voltage of the first region and the second region.

11. The method of claim 10, wherein the forming comprises:
   forming a sacrificial work-function layer over the dielectric layer in the first region, the second region and the third region;
   removing the sacrificial work-function layer selectively in the first region, without affecting the second region or the third region; and
   forming an additional sacrificial work-function layer over the first region, the second region and the third region.

12. The method of claim 11, wherein the forming comprises sizing the additional sacrificial work-function layer with a thickness in the first region relative to the thickness of the sacrificial work-function layer in the second region and the third region, the sizing of the additional sacrificial work-function layer defining the threshold voltage of the first region.

13. The method of claim 11, further comprising selectively removing the multilayer stack structure in the second region, subsequent to the sizing of the additional sacrificial work-function layer in the first region.

14. The method of claim 10, wherein the forming further comprises forming an additional multilayer stack structure in the first region, the second region and the third region, the additional multilayer stack structure is different from the multilayer stack structure.

15. The method of claim 14, wherein the multilayer stack structure in the first region comprises the first threshold-voltage adjusting layer having a first threshold voltage adjusting species, and the additional multilayer stack structure in the second region comprises the second threshold-voltage adjusting layer having a second threshold voltage adjusting species, the first threshold-voltage adjusting layer being different from the second threshold-voltage adjusting layer.

16. The method of claim 10, further comprising a work-function layer disposed over the at least one region, subsequent to the annealing of the structure, wherein the diffusion of the at least one threshold-voltage adjusting species into the dielectric layer defines an effective work-function of the work-function layer in the at least one region, the effective work-function of the work-function layer in the first region, the second region and the third region being independent of each other.

17. The method of claim 16, wherein the effective work-function comprises a first effective work-function of a first p-type field-effect transistor (pFET) device in the first region, and a second effective work-function of a second p-type field-effect transistor (pFET) device in the third region, the first effective work-function being lower than the second effective work-function.

* * * * *